United States Patent [19]

Koda et al.

[11] Patent Number: 5,563,093
[45] Date of Patent: Oct. 8, 1996

[54] METHOD OF MANUFACTURING FET SEMICONDUCTOR DEVICES WITH POLYSILICON GATE HAVING LARGE GRAIN SIZES

[75] Inventors: Munetaka Koda; Yoshikatsu Shida; Junichi Kawaguchi; Takehiro Murakami; Yoshio Kaneko, all of Chiba, Japan

[73] Assignee: Kawasaki Steel Corporation, Hyogo, Japan

[21] Appl. No.: 431,822

[22] Filed: May 1, 1995

Related U.S. Application Data

[63] Continuation of Ser. No. 148,515, Nov. 8, 1993, abandoned.

[30] Foreign Application Priority Data

Jan. 28, 1993 [JP] Japan ................... 5-012604
Jun. 15, 1993 [JP] Japan ................... 5-143866

[51] Int. Cl.$^6$ ................. H01L 21/265; H01L 21/20; H01L 21/70; H01L 27/00
[52] U.S. Cl. ................. 437/101; 437/24; 437/40; 437/57; 437/967
[58] Field of Search ................. 437/29, 56, 24, 437/57, 58, 109, 233, 101, 967, 40 GS, 41 GS

[56] References Cited

U.S. PATENT DOCUMENTS

| | | | |
|---|---|---|---|
| 3,673,471 | 6/1972 | Klein et al. | 317/235 R |
| 4,285,762 | 8/1981 | Moustakas | 156/643 |
| 4,479,831 | 10/1984 | Sandow et al. | 437/29 |
| 4,669,176 | 6/1987 | Kato | 29/571 |
| 4,682,404 | 7/1987 | Miller et al. | 29/571 |
| 4,693,759 | 9/1987 | Noguchi et al. | 437/24 |
| 4,697,333 | 10/1987 | Nakahara | 437/20 |
| 4,891,326 | 1/1990 | Koyanagi | 437/40 |
| 5,045,488 | 9/1991 | Yeh | 437/43 |
| 5,081,066 | 1/1992 | Kim | 437/200 |
| 5,147,826 | 9/1992 | Liu et al. | 437/233 |
| 5,176,756 | 1/1993 | Nakashima et al. | 134/2 |
| 5,210,056 | 5/1993 | Pong et al. | 437/239 |
| 5,214,002 | 5/1993 | Hayashi et al. | 437/234 |
| 5,217,908 | 6/1993 | Nakanishi | 437/24 |
| 5,294,822 | 3/1994 | Verrett | 257/368 |
| 5,296,401 | 5/1994 | Mitsui et al. | 437/57 |
| 5,393,686 | 2/1995 | Yeh et al. | 437/45 |

FOREIGN PATENT DOCUMENTS 3-290294 12/1991 Japan .
4-152624 5/1992 Japan .

OTHER PUBLICATIONS

Stanley Wolf and Richard N. Tauber, "Silicon Processing for the VLSI Era", vol. 1, pp. 178–179, (1986).
Davari, B. et al., "A High–Performance 0.25–μm CMOS Technology: II–Technology, " *IEEE Transactions on Electron Devices*, vol. 39, No. 4, Apr. 1992, pp. 967–975.
Lin, W. et al., "Dopant Diffusion in n$^+$/p$^+$Poly Gate CMOS Process," *Solid–State Electronics* , vol. 32, No. 11, pp. 965–969, 1989.
"VLSI Fabrication Principles", by Sorab K. Ghandi, 1983, pp. 517–520.

*Primary Examiner*—Mary Wilczewski
*Assistant Examiner*—Brian K. Dutton
*Attorney, Agent, or Firm*—Oliff & Berridge

[57] ABSTRACT

The present invention provides the method of manufacturing a dual-gate CMOS device which has high transconductance and improved breakdown voltage, in which depletion in the interface between a gate oxide and a gate electrode is prevented without the increase of the steps of process.

A gate oxide film (5) formed on a semiconductor substrate (1) is washed with an aqueous solution, or exposed to a gas atomosphere containing hydrogen, and an amorphous silicon film (3) is formed on the whole surface of the gate oxide film (5). The amorphous silicon film (3) is then crystallized. Alternatively, after a silicon oxide film (53) or a silicon nitrided film is formed on the amorphous silicon film (3), the amorhpous silicon film (3) is crystallized.

10 Claims, 7 Drawing Sheets

METHOD OF MANUFACTURING FET SEMICONDUCTOR DEVICES WITH POLYSILICON GATE HAVING LARGE GRAIN SIZES

This is a Continuation of application Ser. No. 08/148,515 filed Nov. 8, 1993, now abandoned.

BACKGROUND OF THE INVENTION

1. Field of the Invention

The present invention relates to a method of manufacturing a semiconductor device including complementary MOSFETs having both an n-ch MOSFET (Metal Oxide Semiconductor Field Effect Transistor) and a p-ch MOSFET on the same substrate, and in particular, to a method of manufacturing a dual-gate CMOS device which consists of an n-ch MOSFET having an n-type impurities doped polysilicon gate and a p-ch MOSFET having a p-type impurities doped polysilicon gate.

2. Description of the Prior Art

Conventionally, a gate electrode of complementary MOSFETs has been formed by patterning polysilicon film after doping by ion implanting and/or solid-phase diffusing n-type impurities (n-type dopant) such as phosphorous (hereinafter, referred as "P") or arsenic (hereinafter, referred as "As") into a polysilicon film. In this case, the n-ch MOSFET is formed as a surface channel type and the p-ch MOSFET is formed as a buried channel type.

Specifically, the prior art complementary MOSFETs have a structure in which gate electrodes of both the n-ch MOSFET and the P-ch MOSFET are of n-type, and in the n-ch MOSFET, a source and a drain are of n-type, and in the p-ch MOSFET, a source and a drain are of p-type.

However, recently, semiconductor devices have been progressed in making finer and higher in integration, and as a result, elements have also been made finer. For example, fine MOSFETs having a gate length of 0.5 μm or less have been used.

In the fine MOSFETs, it is essential to suppress the short channel effect. For this reason, the gate electrode of the p-ch MOSFET is made p-type, and the surface channel type p-ch MOSFET which has higher capability of suppressing the short channel effect than the buried channel MOSFET has been used.

In the prior art complementary MOSFETs, techniques for forming both the n-ch MOSFET and the p-ch MOSFET as the surface type are proposed, for example, by Bijan Davari et al. in "IEEE Transaction on Electron Devices", Vol. 39, p 967, 1992, and by Wen Lin et al. in "Solid-State Electronics", Vol. 32, p 965, 1989.

These techniques include the following processes.

First, after forming a polysilicon film which is a gate electrode forming material, this film is patterned to form a gate electrode. Subsequently, n-type impurities are ion implanted selectively into a region in which an n-ch MOSFET is to be formed thererby to form an n-type gate electrode, and n-type source and drain.

Thereafter, p-type impurities are ion implanted selectively into a region in which a p-ch MOSFET is to be formed thereby to form a p-type gate electrode, and p-type source and drain.

Specifically, in both the p-ch MOSFET and n-ch MOSFET, the ion implantation to form the source and drain, and the ion-implantation of impurities to reduce a resistance of the gate electrode are simultaneously performed.

The advantage is provided in that in both the MOSFETs, the surface impurity concentration is sufficiently high in the source and drain, and shallow junctions are formed in the source and drain.

However, in the technique to form the channels of both the MOSFETs as being of the surface type, there is a problem in that although the shallow junctions are formed in the source and drain, the carrier concentration in the gate electrode becomes low. As a result, when a low voltage is applied to the gate electrode of the MOSFET, the transconductance and the sub-threshold characteristic of the MOSFET are degraded.

This is caused by the fact that the activation ratio of the impurities in the polysilicon film is 1/10 to 1/100 of the activation ratio of the impurities in the monocrystalline silicon film.

Accordingly, for example, when the impurities having a concentration of about $1 \times 10^{15}/cm^2$ are ion implanted to the gate electrode and the source and drain, in the source and drain, the carrier concentration is about $1 \times 20^{20}/cm^3$, whereas in the gate electrode, it is about $1 \times 10^{19}/cm^3$. Here, for example, when the gate oxide film has a film thickness of 7 nm, the carrier concentration required for the gate electrode is $1 \times 20^{20}/cm^3$ or more. If the carrier concentration of the gate electrode is less than this value, during the operation of the MOSFET under a low gate voltage, an electrical depletion layer will be caused in an interface between the gate oxide film and the gate electrode (polysilicon film), and a problem is posed in that the transconductance of the MOSFET is reduced to a great extent and the sub-threshold characteristic is deteriorated.

Furthermore, the inventors of the present application discovered that in the case of the gate oxide with a polysilicon electrode having a low dopant concentration, the initial breakdown voltage is abnormally reduced.

Specifically, when a MOS capacitor having an area of 4 $mm^2$ is formed in the process in which first, a gate-electrode-forming polysilicon film of about 150 nm in film thickness is formed on a gate oxide film of about 8 nm in film thickness, and then, boron difluoride (hereinafter, referred to as "$BF_2$") ions are implanted into the polysilicon film with a concentration of $1 \times 10^{15}/cm^2$, and then, the ion-implanted polysilicon film is activated, the frequency of having the intrinsic breakdown voltage of the MOS capacitor was about 22% of the total number. On the other hand, in a polysilicon film in which the $BF_2$ ions are implanted with a concentration of $1 \times 10^{16}/cm^2$, the above-mentioned frequency was about 98%. This is because that in the polysilicon film of low impurity concentration, the growth of crystal grain was insufficient.

Accordingly, various methods have been considered.

(1) A method in which in order to improve the activation of the impurities implanted into the gate electrode (polysilicon film), the amount of ion-implantation of impurities is increased, and to activate the impurities, the temperature of a thermal treatment is increased.

(2) A method in which in addition to the impurities ion-implantation process for forming the source and drain, impurities are ion implanted selectively to the gate electrode thereby to increase the carrier concentration of the gate electrode.

However, in the method (1), since the amount of ion-implantation of the impurities is increased, or the temperature of the thermal treatment is increased, there is a problem in that the junctions of the source and drain become deep, and the short channel effect is caused so that it cannot be applied to fine MOSFETs. Furthermore, when the thickness of the gate oxide film is as thin as 100 Å or less, and when boron which is the p-type impurity is contained with a high concentration, there is a problem in that the boron penetrates the gate oxide film and reaches the silicon substrate. As a method of preventing this defects, it has been tried to use a silicon oxynitride film which is formed by oxidizing the silicon in $N_2O$ atmosphere as the gate insulating film.

Furthermore, in the method (2), since the impurity ions of p-type or n-type are selectively implanted into the gate electrode, a problem is posed in that in each of the masking process and the ion implantation process, two processes are increased and the productivity is reduced to a great extent.

Recently, polysilicon thin film transistors have been developed for use as a driver of a liquid crystal display and a load transistor of a high integrated SRAM cell. In order to improve the performance, trials have been conducted to improve the mobility of carriers in the polysilicon. One trial is to subject an amorphous silicon formed on an insulating substrate to a thermal treatment to transform the amorphous silicon into a polysilicon having a relatively large crystal grain size so as to improve the mobility of the carriers.

(3) A method in which, as disclosed in Japanese Patent Laid-Open Publication Hei No. 3-290924, an amorphous silicon film is formed on a quartz substrate, and after patterning this film, a thermal treatment at 500° C. for 20 hours, and a further thermal treatment at 1020° C. for 2 hours are carried out in an inactive gas to increase the crystal grain size of the silicon film to a large grain size of about 2 to 3 μm thereby to improve the activation of the impurities in the silicon film.

(4) A method in which, as disclosed in Japanese Patent Laid-Open Publication Hei No. 4-152624, an amorphous silicon film is formed on a quartz substrate, and after patterning this film, the amorphous silicon film is crystallized in oxygen atmosphere of 99.99% or more to have a large grain size of the silicon film of about 2 μm thereby to improve the activation of the impurities in the silicon film.

However, in the method (3), there is a problem in that it takes a too long thermal treatment time, and it lacks the mass-productivity. A further problem is involved in that when the line width is decreased to 1 um or less, it is impossible to increase the crystal grain size, and the activity of the impurities cannot be improved.

Also in the method (4), although the activation ratio of the impurities is improved to that equivalent to a monocrystalline silicon film, since the oxygen concentration at the time of crystallization is high, the surface of the silicon film is oxidized and doped impurities are absorbed in oxide film. Accordingly, a problem is involved in that the activation of the impurities is decreased.

SUMMARY OF THE INVENTION

The present invention solves the problems in the prior art dual gate CMOS by using as the gate electrode of the dual gate CMOS a polysilicon of a large grain size which is formed by subjecting an amorphous silicon to a thermal treatment. The present invention provides a method of transforming the amorphous silicon formed on gate insulating film into polysilicon having large grain size.

Specifically, an object of the present invention is to provide a method of manufacturing a dual gate CMOS in which the mobility and the carrier concentration of the impurities are improved by increasing the grain size of a polysilicon used for a gate electrode, and the depletion in the interface between the gate electrode and the gate insulating film is prevented without increasing the concentration of impurities implanted into the gate electrode, and the transconductance is improved.

Another object of the present invention is to provide a method of manufacturing a dual gate CMOS in which the transconductance is improved without increasing the number of processes by simultaneously performing the impurities introduction into the gate electrode and into the source and drain.

A still another object of the present invention is to provide a method of manufacturing a dual gate CMOS in which the breakdown voltage of the gate oxide film is improved to a great extent as compared with that of the gate oxide film of the prior art dual gate CMOS which employs a polysilicon electrode having a low dopant concentration.

In a first aspect of the present invention, a gate oxide film formed on a device forming region of a semiconductor substrate is washed with an aqueous solution, or is exposed to a gas atmosphere containing hydrogen so that a surface of the gate oxide film is terminated by a hydroxyl group.

Specifically, an Si—O bond having a distorted non-bonded hand of oxygen atom is present on the surface of the gate oxide film. This non-bonded hand is bonded to a hydrogen by washing the gate oxide film with the aqueous solution, or exposing to the gas atmosphere containing the hydrogen. Accordingly, the surface of the gate oxide film is terminated by the hydroxyl group. After the surface of the gate oxide film is terminated by the hydroxyl group, an amorphous silicon film is formed thereon, and by crystallizing the amorphous silicon film, a silicon film (polysilicon film) having a coarse and large crystal grain size is obtained.

When the Si—O bond is present on the surface of the gate oxide film, at the time of forming the amorphous silicon film on the gate oxide film, and crystallizing the amorphous silicon film, the formation of crystal nuclei of silicon is promoted. As a result, a great number of crystal nuclei are generated in the amorphous silicon film, and since the crystallization is progressed from this site, adjacent crystal grains will collide with each other before the crystal grains grow sufficiently, and the growth of the crystal grains will be stopped. For this reason, it is impossible to increase the crystal grain size of the silicon film (polysilicon film) which is obtained by crystallizing the amorphous silicon film.

In order to obtain the silicon film having a large crystal grain size, it is necessary to suppress the formation of the crystal nuclei of the silicon at the time of crystallizing the amorphous silicon film by removing the Si—O bond from the surface of the gate oxide film and by terminating the surface of the gate oxide film by the hydroxyl group.

Here, the silicon film having a large crystal grain size includes less grain boundaries, and the impurities which are segregated here are reduced. Accordingly, when this silicon film is used as a gate electrode material, the carrier concentration of the gate electrode is increased, and the activation ratio is improved to a great extent. As a result, it is possible to suppress the occurrence of depletion in the interface between the gate oxide film and the gate electrode during operation of the transistor. The same advantage is obtained also in the case where the gate insulating film is formed by a silicon oxynitride film.

In a second aspect of the present invention, the surface of the amorphous silicon film formed on the gate insulating film is oxidized or nitrided to form an oxide film or a nitrided film on the amorphous silicon film. This surface film suppresses the formation of the crystal nuclei of silicon at the time of crystallizing the amorphous silicon film in a subsequent process.

Specifically, in crystallizing the amorphous silicon film, the crystal nuclei are generated from the surface, and the crystallization is progressed from here. At this time, the generation of the crystal nuclei is caused by the movement of silicon atoms in the surface. Since the movement of silicon atoms is interrupted by the oxide film or the nitride film formed on the amorphous silicon film, the generation of the crystal nuclei of silicon is suppressed. Accordingly, the grain size of the silicon film (polysilicon film) obtained by crystallization is made coarse and large.

In a third aspect of the present invention, the amorphous silicon film formed on the gate insulating film is patterned, and after coating the surface with an oxide film, or a nitrided film, or a CVD film, the amorphous silicon film is crystallized. As a result, the movement of silicon atoms is interrupted by the oxide film, or the nitrided film, or the CVD film. Thus, the generation of the crystal nuclei of silicon is suppressed, and the grain size of the polysilicon film obtained by crystallization is made coarse and large.

In a fourth aspect of the present invention, the amorphous silicon film formed on the gate insulating film is patterned, and the amorphous silicon film is crystallized in an oxidizing atmosphere or nitriding atmosphere. As a result, the patterned amorphous silicon film is crystallized while its surface is oxidized or nitrided. In other words, the amorphous silicon film is crystallized while the oxide film or the nitrided film is being formed on the surface. Accordingly, at the time cystallizing the amorphous silicon film, the movement of silicon atoms existing in the surface of the amorphous silicon film is interrupted by the formed oxide film or the nitrided film, and the generation of the crystal nuclei of silicon is suppressed. As a result, the grain size of the polysilicon film obtained by crystallization is made coarse and large.

In a fifth aspect of the present invention, after the amorphous silicon film formed on the gate insulating film is patterned, and a gate electrode is formed, n-type impurities are introduced into an n-ch FET forming region, and p-type impurities are introduced into a p-ch FET forming region, so that the impurities introduction into a gate, a source and a drain of each FET is performed simultaneously. Furthermore, by crystallizing the amorphous silicon film, the activation of the impurites in the gate, source, and drain is performed simultaneously with the crystallization of the amorphous silicon film.

Here, in a prior art method of activating the dopant throughout the polysilicon film implanted the impurities from the surface, there is a problem in that the impurities are difficult to be diffused deep into the polysilicon film. When the impurities are ion implanted while the gate electrode forming material is in an amorphous state, and when the activation of the impurities is performed simultaneous with the crystallization of the amorphous silicon film, the impurities are diffused deep together with the crystallization of the amorphous silicon film. By virtue of this, the carrier concentration in the crystallized silicon film (gate electrode) is increased at a relatively low temperature and in a short time.

In a sixth aspect of the present invention, a silicon film is formed in an atmosphere using $Si_2H_6$ at 580° C. or lower on the whole surface of a gate insulating film which is formed in a device forming region of the semiconductor substrate. Accordingly, it is possible to form the silicon film in an amorphous state. After a gate electrode is formed by patterning the amorphous silicon film, n-ch impurities are introduced into an n-ch FET forming region, and p-ch impurities are introduced into a p-ch FET forming region, and the impurities are activated simultaneous with the crystallization of the amorphous silicon film. As a result, the grain size of the polysilicon film can be increased. Thus, the impurities which are segregated in grain boundaries are reduced, and the carrier concentration can be increased. Also, it is possible to increase the activation ratio as large as 10 times that of normal polysilicon film.

As a result, it is possible to prevent the depletion in the interface between the gate insulating film and the gate electrode, and the reduction of the transconductance of MOSFET can be suppressed.

When the film forming temperature of the silicon film exceeds 580° C., crystal nuclei are generated in the silicon film and it becomes difficult to form the amorphous silicon film. It is also possible to form the amorphous silicon film by using $SiH_4$ or $Si_3H_8$ without using the above-mentioned $Si_2H_6$, and at a film forming temperature of 580° C. or low, the film forming rate is reduced and the efficient film formation is impossible.

Accordingly, it is optimum to form the silicon film by using the $Si_2H_6$, and at the film forming temperature of 580° C. or low.

Furthermore, since the carrier concentration of the gate electrode can be made comparable to that of the source and drain, the surface of the gate electrode and the surface of the source and drain are not necessarily formed with silicide, and a sufficiently low sheet resistance can be obtained. Thus, the process can be made simple.

When a CVD film is formed after patterning the amorphous silicon film formed on the gate oxide film, the movement of silicon atoms existing on the surface of the amorphous silicon film is interrupted by the CVD film. Accordingly, the generation of the crystal nuclei of silicon is suppressed, and the grain size of the silicon film (polysilicon film) which is obtained by crystallization can be made coarse and large.

In a seventh aspect of the present invention, Si ions or Ge ions are introduced into a polysilicon film formed on the whole surface of a gate oxide film on a device forming region of the semiconductor substrate. After forming a gate electrode after patterning the polysilicon film, n-type impurities are introduced into an n-type device forming region, and p-type impurities are introduced into a p-type device forming region, and the impurities are activated. Accordingly, it is possible to increase the activation ratio of the impurities in the polysilicon film having the Si ions or Ge ions introduced therein to as large as 10 times the activation ratio of the impurities in the polysilicon film.

Specifically, by introducing the the Si ions or Ge ions into the polysilicon film, the crystals in the polysilicon film are transformed into an amorphous state. By crystallizing the amorphous silicon film, a larger grain size polysilicon film is obtained. Accordingly, since a little impurities are segregated in the grain bounderies, the carrier concentration of the gate electrode can be increased. Thus, the generation of a depletion layer in an interface between the gate insulating film and the gate electrode can be prevented. In addition, the reduction of the transconductance of the MOSFET can be suppressed.

In an eighth aspect of the present invention, since a silicon oxide film or a silicon oxynitride film is used as the gate insulating film in the first to seventh aspect of the present invention, the Si—O bond having a distorted non-bonded hand of oxygen atom is present in the surface. Hydrogen is bonded to the non-bonded hand by washing the surface with an aqueous solution or by exposing the surface to a gas containing the hydrogen, and the surface of the gate insulating film is terminated by a hydroxyl group. It is possible to form a large grain size polysilicon film by crystallizing the amorphous silicon film formed on this gate insulating film.

Furthermore, in a dual gate CMOS having a gate electrode of a p-ch FET containing boron as p-type impurities, when the film thickness of the gate insulating film is small, it is preferable to use the silicon oxynitride film which provides a significant penetration preventing effect.

In a ninth aspect of the present invention, after forming the amorphous silicon film in the first to seventh aspect of the present invention, the amorphous silicon film is subjected to a thermal treatment at a temperature of 600° C. C. or higher to cause a solid phase crystal growth of the amorphous silicon. Thus, it is possible to form a polysilicon film of a large grain size.

In a tenth aspect of the present invention, the amorphous silicon film in the first to fifth aspect of the present invention is formed by using one of monosilane, disilane, and trisilane.

In an eleventh aspect of the present invention, the amorphous silicon film is formed by using the disilane at a temperature of 580° C. or low, and thus, the amorphous silicon film can be formed more reliably and efficiently.

DESCRIPTION OF THE PREFERRED EMBODIMENTS

EXAMPLE 1

Figure 1:
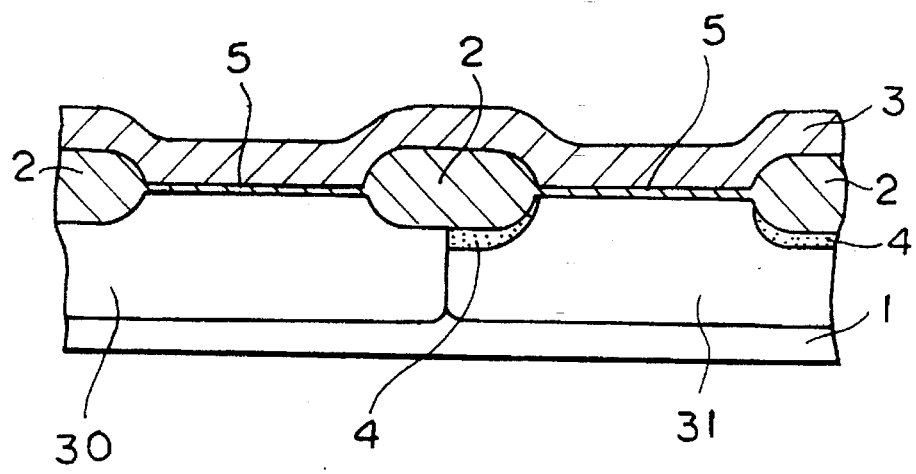
FIG. 1 is a partial sectional view showing a part of a manufacturing method of a semiconductor device of an example 1 of the present invention.

With reference to FIGS. 1 to 7, a method of manufacturing a semiconductor device in Example 1 will be described.

In a process shown in FIG. 1, in a p-type semiconductor substrate 1 of a plane orientation (100), a p-well 31 is formed in a region (hereinafter, referred to as "n-type region") for forming an n-type device, and an n-well 30 is formed in a region (hereinafter, referred to as "p-type region") for forming an p-type device.

Subsequently, by a known method, a field oxide film 2 is formed in a device separating region of the semiconductor substrate 1, and then, an inversion preventing layer 4 is formed under the field oxide film 2 which is formed in the n-type region.

The wafer is thermally oxidized to form a gate oxide film 5 having a film thickness of about 7 nm on the device forming region of the semiconductor substrate 1.

After washing the gate oxide film 5 for 1 minute with a mixture of ammonia, hydrogen peroxide, and water (NH4OH: $H_2O_2$:$H_2O$=1:1:5 (volume ratio)) at 40° C., it is washed for 10 minutes with pure water, and then, it is dried by rotating at high speed. By this process, the surface of the gate oxide film 5 is bonded with a hydroxyl group (the gate oxide film 5 is terminated by the hydroxyl group).

Subsequently, an amorphous silicon film 3 having a film thickness of about 150 nm is formed on the whole surface of the wafer by using a $Si_2H_6$ gas at temperature of 550° C. In this case, the silicon film becomes the amorphous silicon film 3 under the above-mentioned film forming conditions.

Figure 2:
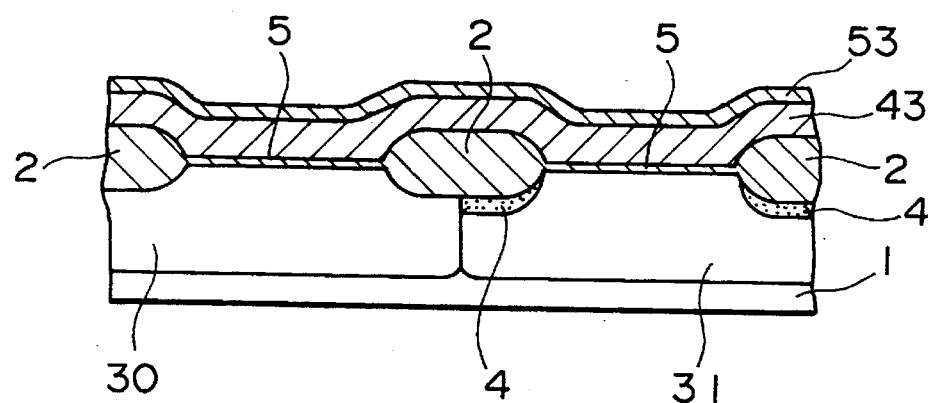
FIG. 2 is a partial sectional view showing a part of a manufacturing method of a semiconductor device of the example 1 of the present invention.

In the process shown in FIG. 2, the wafer obtained by the process shown in FIG. 1 is maintained in an oxygen atmosphere at 400° C. for 10 minutes, and a silicon oxide film 53 of about 5 nm in thickness is formed on the surface of the amorphous silicon film 3.

The wafer is subjected to a thermal treatment in a nitrogen atmosphere at 600° C. for 5 hours to crystallize the amorphous silicon film 3, and the crystallized silicon film (polysilicon film) 43 is formed.

At this time, since the hydroxyl group is bonded to the surface of the gate oxide film 5, in crystallizing the amorphous silicon film 3, the formation of crystal nuclei of silicon in the interface between the gate oxide film 5 and the amorphous silicon film 3 is suppressed. Furthermore, since the silicon oxide film 53 is formed on the surface of the amorphous silicon film 3, in crystallizing the amorphous silicon film 3, the movement of silicon atoms in the surface of the amorphous silicon film 3 is suppressed. Accordingly, in the surface of the amorphous silicon film 3, the formation of the crystal nuclei of silicon is suppressed. As a result, it is possible to suppress to a minimum the number of the crystal nuclei which are generated at the time of crystallizing the amorphous silicon film 3. For the reason mentioned above, it is possible to make crystal grains of the crystallized silicon film 43 sufficiently coarse and large.

Figure 3:
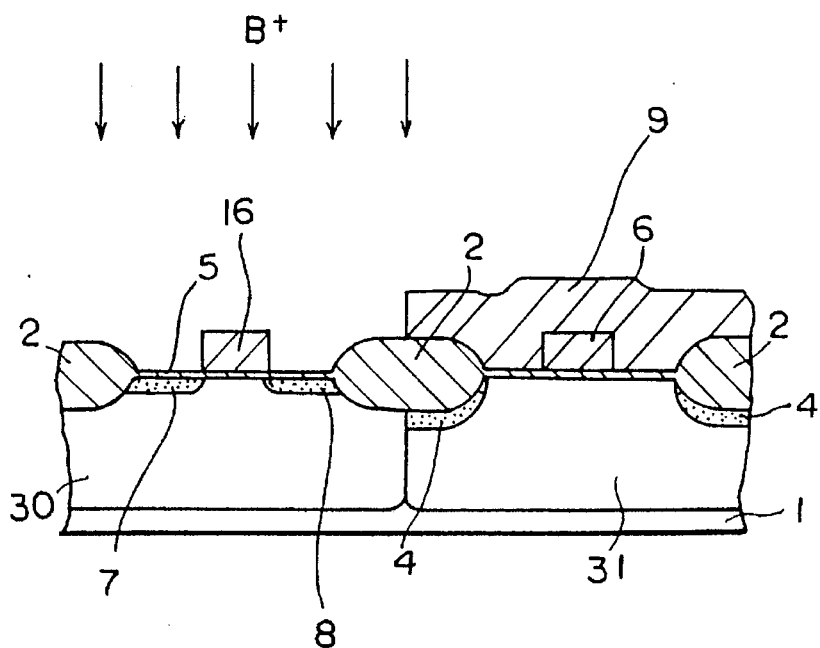
FIG. 3 is a partial sectional view showing a part of a manufacturing method of a semiconductor device of the example 1 of the present invention.

In the process shown in FIG. 3, after removing the silicon oxide film 53 obtained in the process shown in FIG. 2, the crystallized silicon film 43 is patterned, and a gate electrode 6 having a gate length of 0.35 μm is formed on each of the n-type region and the p-type region.

Subsequently, a resist film 9 is coated on the n-type region of the wafer, and by using this resist film 9 as a mask, $B^+$ is ion implanted as p-type impurities into the p-type region with the amount of implantation=$1\times10^{13}$/cm$^2$ and the implantation energy=10 KeV, and a p$^-$ diffusion layer 7 and a p$^-$ diffusion layer 8 are formed.

Figure 4:
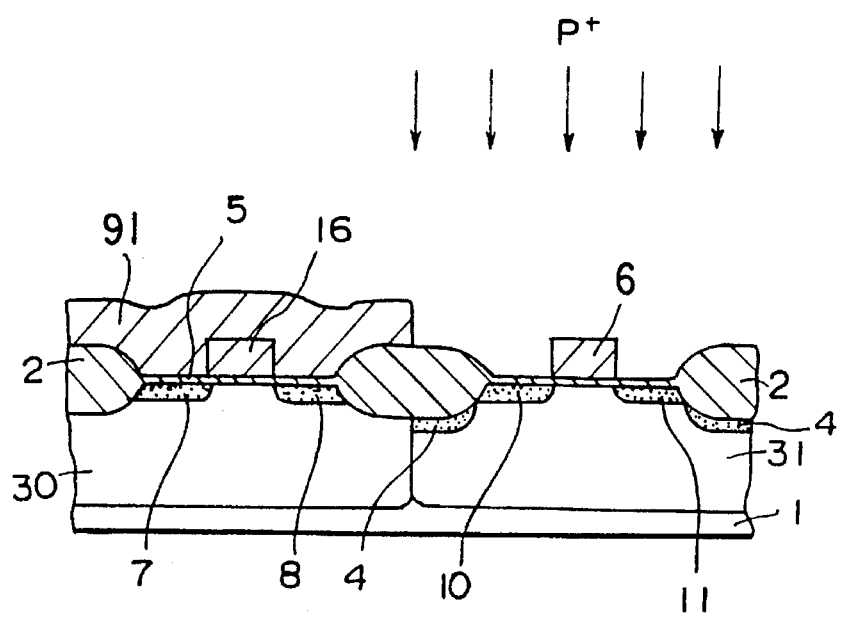
FIG. 4 is a partial sectional view showing a part of a manufacturing method of a semiconductor device of an example 1 of the present invention.

In the process shown in FIG. 4, after removing the resist film 9 obtained in the process shown in FIG. 3, a resist film 91 is coated on the p-type region of the wafer, and by using this resist film 91 as a mask, P$^+$ is ion implanted as n-type impurities into the n-type region with the amount of implantation=$4\times10^{13}$/cm$^2$, and the implantation energy=30 KeV, and an n– diffusion layer 10 and an n$^-$ diffusion layer 11 are formed.

Figure 5:
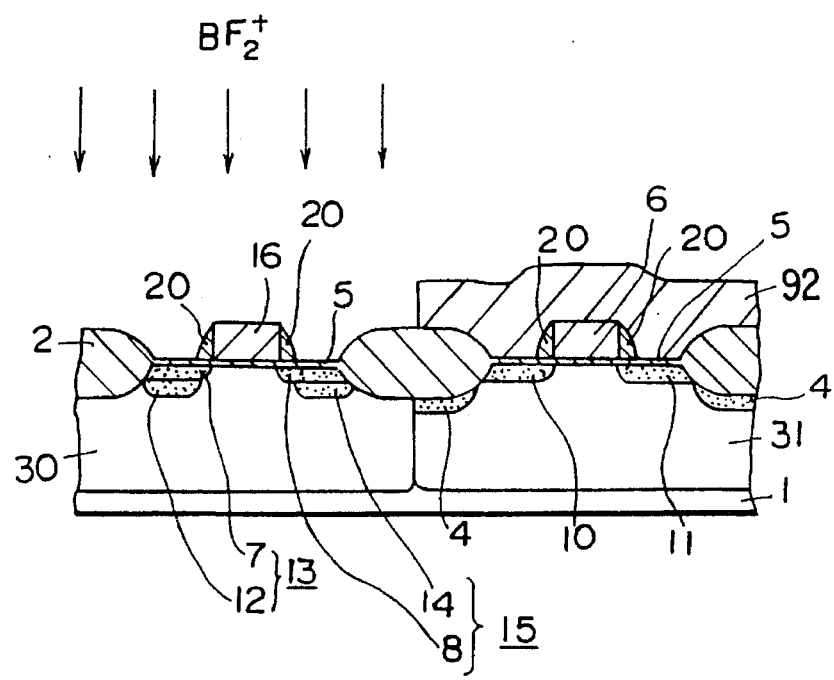
FIG. 5 is a partial sectional view showing a part of a manufacturing method of a semiconductor device of the example 1 of the present invention.

In the process shown in FIG. 5, after removing the resist film 91 obtained in the process shown in FIG. 4, and after forming side walls 20 on each of the gate electrodes 6 and 16, a resist film 92 is coated on the n-type region of the wafer, and by using this resist film 92 as a mask, BF$_2^+$ is ion implanted as p-type impurities into the p-type region with the amount of implantation=$1\times10^{15}$/cm$^2$, and the implantation energy=40 KeV, and a p$^+$ diffusion layer 12 and a p$^+$ diffusion layer 14, and a p-type gate electrode 16 are formed. In this case, since the gate electrode 16 consists of the crystallized silicon film 43 having a large crystal grain size, the amount of the BF$_2$ which is segregated in the grain bounderies is small, and it is diffused into the crystallized silicon film 43. Accordingly, as compared with the prior art gate electrode which consists of the polysilicon film, it is possible to obtain a p-type gate electrode 16 with a remarkably increased carrier concentration.

Figure 6:
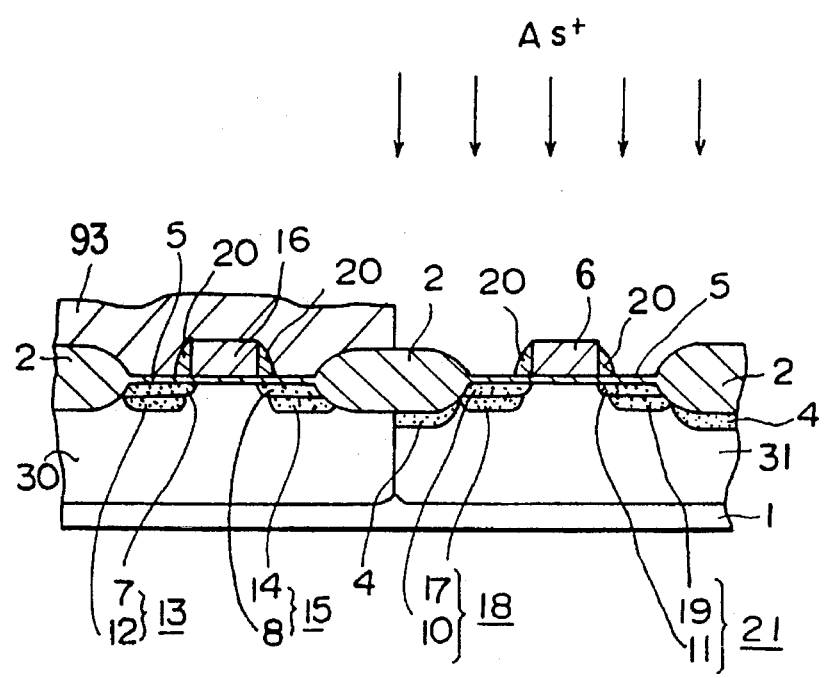
FIG. 6 is a partial sectional view showing a part of a manufacturing method of a semaconductor device of the example 1 of the present invention.

In the process shown in FIG. 6, after removing the resist film 92 obtained in the process shown in FIG. 5, a resist film 93 is coated on the p-type region of the wafer, and by using this resist film 93 as a mask, As$^+$ is ion implanted as n-type impurities into the n-type region with the amount of implantation=$2\times10^{15}$/cm$^2$, and the implantation energy=40 KeV, and an n$^+$ diffusion layer 17 and an n+ diffusion layer 19, and an n-type gate electrode 6 are formed. In this case, since the gate electrode 6 consists of the crystallized silicon film 43 having a large crystal grain size, the amount of the As which is segregated in the grain boundaries is small, and it is diffused into the crystallized silicon film 43. Accordingly, as compared with the prior art gate electrode which consists of the polysilicon film, it is possible to obtain the n-type gate electrode 6 with a remarkably increased carrier concentration.

Subsequently, the wafer after the ion implantaion is completed, and after the resist is removed, is placed in a known diffusion furnace, and a thermal treatment is performed at 850° C. for 30 minutes. In this manner, the impurities are activated, and a source 13 including the p$^-$ diffusion layer 7 and the p$^+$ diffusion layer 12, and a drain 15 including the the p$^-$ diffusion layer 8 and the p$^+$ diffusion layer 14, a source 18 including the n$^-$ diffusion layer 10 and the n$^+$ diffusion layer 17, and a drain 21 including the n$^-$ diffusion layer 11 and the n$^+$ diffusion layer 19 are formed.

Figure 7:
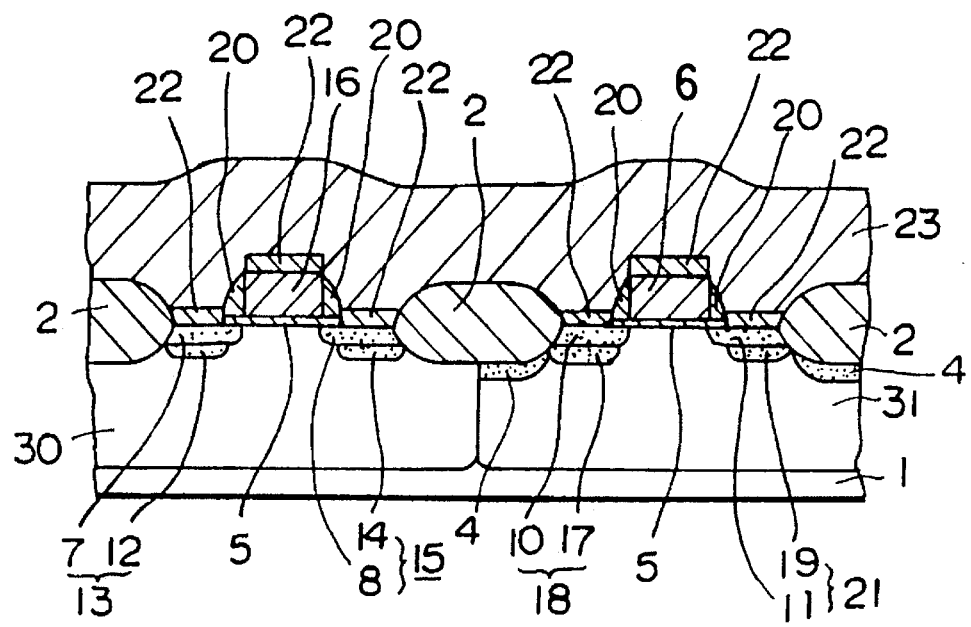
FIG. 7 is a partial sectional view showing a part of a manufacturing method of a semiconductor device of the example 1 of the present invention.

In the process shown in FIG. 7, after removing the oxide film formed on the gate electrodes 6 and 16, on the sources 13 and 18, and on the drains 15 and 21, a titanium film of about 20 nm in film thickness is formed over the whole surface.

The wafer formed with the titanium film is placed in a quick heating apparatus, and the wafer is subjected to a thermal treatment at 650° C. for 30 seconds, and the titanium film formed on the gate electrodes 6 and 16, on the sources 13 and 18, and on the drains 15 and 21 is transformed to silicide thereby to form a titanium silicide film 22 on these portions.

Subsequently, the titanium film which is not reacted in the transformation to the silicide is removed by a mixture of ammonia, hydrogen peroxide, and water. Thereafter, the wafer is again placed in the quick heating apparatus, and the wafer is subjected to a thermal treatment at 800° C. for 30 seconds. Following this, an interlayer dielectric film 23 is formed on the whole surface of the wafer.

Thereafter, a desired process is performed including an opening of a contact hole, and the like, and a semiconductor device including complementary MOSFETs is completed.

In the Example 1 shown in FIG. 1, the gate oxide film 5 is washed with a mixture of ammonia, hydrogen peroxide, and water, and the surface of the gate oxide film 5 is terminated by the hydroxyl group. However, the present invention is not limited to this, the gate oxide film 5 may be washed with an aqueous solution such as an aqueous solution of hydrofluoric acid, a mixture of hydrochloric acid and hydrogen peroxide and water, a mixture of sulfuric acid and hydrogen peroxide and water, or water, and alternatively, the gate oxide film 5 may be exposed to an gas atmosphere containing hydrogen such as a hydrogen gas, an ammonia gas, steam, hydrogen plasma, or the like, so that the surface of the gate oxide film 5 is terminated by a hydroxyl group.

Furthermore, in the process shown in FIG. 1, the amorphous silicon film 3 is formed by using the Si$_2$H$_6$ gas, at the temperature of 550° C. However, the present invention is not limited to this, and the amorphous silicon film 3 may be formed by using a SiH$_4$ gas or a Si$_3$H$_8$ gas, and at a film forming temperature of 580° C. or low.

In the process shown in FIG. 2, the wafer obtained in the process shown in FIG. 1 is maintained in the oxygen atmosphere at 400° C. for 10 minutes, and the silicon oxide film 53 is formed on the surface of the amorphous silicon film 3. However, the present invention is not limited to this, and the other atmosphere gases may be used if it is possible to form the silicon oxide film on the surface without crystallizing the amorphous silicon film 3.

Furthermore, in the Example 1, B$^+$, and BF$_2^+$ ions are ion implanted in the p-type region as the p-type impurites, however, the present invention is not limited to this, and the other kinds of p-type impurites may be ion implanted. Also, the ion implantation conditions (the amount of implantation, the implantation energy, etc.) may be determined as required.

Furthermore, in the Example 1, P$^+$, and As$^+$ ions are ion implanted in the n-type region as the n-type impurites, however, the present invention is not limited to this, and the other kinds of n-type impurites may be ion implanted. Also, the ion implant at ion conditions (the amount of implantation, the implantation energy, etc.) may be determined as required.

Furthermore, in the Example 1, the wafer which has been ion implanted in the process shown in FIG. 6 is subjected to the thermal treatment at 850° C. for 30 minutes, however, the present invention is not limited to this, and the method of thermal treatment may be determined as desired, for example, a quick heating apparatus is used and the thermal treatment is performed at a temperature of about 900° to 1100° C., and for 10 to 60 seconds.

The size of the device described in the Example is one example, and it may be changed.

Subsequently, on the based on the Example 1, samples 1 to 12 of the present invention are manufactured. In this case, as to the samples 1 to 3, 5 and 6, and 11 and 12, the surface treatment of the gate oxide film 5 which is performed in the process shown in FIG. 1 is omitted. Furthermore, as to the samples 7 to 10, the surface treatment (oxidizing treatment) of the amorphous silicon film 3 is omitted in the process shown in FIG. 2.

For the purpose of comparison, as shown in the conditions in Table 1, in the process shown in FIG. 1, after a gate oxide film 5 is formed, Si2H6 is used instantly, and an amorphous silicon film having a film thickness of about 151 nm is formed at a film forming temperature of 480° C., just thereafter, a thermal treatment is performed in an nitrogen atmosphere at 600° C. for 5 hours thereby to crystallize the amorphous silicon film. Following this, in the process shown in FIG. 2, after omitting the surface treatment (oxidization treatment) of the amorphous silicon film 3, the successive processes are performed, and a semiconductor device including complementary MOSFETs is completed (comparative piece 1).

For the purpose of comparison, as shown in the conditions in Table 1, in the process shown in FIG. 1, after a gate oxide film 5 is formed, $SiH_4$ is used instantly, and an amorphous silicon film having a film thickness of about 151 nm is formed at temperature of 550° C., just thereafter, a thermal treatment is performed in a nitrogen atmosphere at 600° C. for 5 hours thereby to crystallize the amorphous silicon film. Following this, in the process shown in FIG. 2, after omitting the surface treatment (oxidization treatment) of the amorphous silicon film 3, the successive processes are performed, and a semiconductor device including complementary MOSFETs is completed (comparative piece 2).

For the purpose of comparison, as shown in the conditions in Table 1, in the process shown in FIG. 1, after a gate oxide film 5 is formed, $SiH_4$ is used instantly, and an amorphous silicon film having a film thickness of about 149 nm is formed at temperature of 620° C., just thereafter, a thermal treatment is performed in a nitrogen atmosphere at 600° C. for 5 hours thereby to crystallize the amorphous silicon film. Following this, the process shown in FIG. 2 and the successive processes are performed, and a semiconductor device including complementary MOSFETs is completed (comparative piece 3).

With respect to the samples 1 to 12 and the comparative pieces 1 to 3, an average crystal grain size of the crystallized silicon film (polysilicon film) is measured.

The results are shown in Table 1.

Subsequently, with respect to the samples 1 to 12 and the comparative pieces 1 to 3, the quasi-static capacitance measurement of the p-type region and the n-type region is conducted by the following method.

A value (Cinv/Cox) is obtained by dividing a capacitance (Cinv) at the time of strong inversion of the semiconductor substrate by a capacitance (Cox) of the semiconductor substrate in an accumulation condition.

The results are shown in Table 1.

From Table 1, it is confirmed that in the samples 1 to 12, the average crystal grain size of the crystallized silicon film (polysilicon film) 43 is made coarse and large as large as 2.4 to 3.3 μm as compared with the comparative pieces 1 to 3 in which the crystal grain size is as small as 0.05 to 0.91 μm.

This is because that in the samples 1 to 12, the gate oxide film 5 is subjected to the thermal treatment in the first aspect of the present invention, or/and the amorphous silicon film 3 is subjected to the surface treatment in the second aspect of the present invention, and that in crystallizing the amorphous silicon film 3, the generation of the crystal nuclei is suppressed to a minimum extent.

Furthermore, as will be seen from Table 1, in the samples 1 to 12, in both the p-type region and the n-type region, the value of Cinv/Cox is as good as 0.99 whereas in the comparative pieces 1 to 3, the value was 0.95 or less.

In this respect, the value of Cinv/Cox has a correlation with the transconductance of the MOSFET during its operation (during channel forming), and it is known that generally, when the value of Cinv/Cox is 0.98 or larger, the depletion is difficult to occur in the interface between the gate oxide film and the gate electrode during operation of the MOSFET. That is, it is known that sufficiently large transconductance can be ensured.

On the other hand, it is known that when the value of Cinv/Cox decreases to 0.95 or less, the transconductance of the MOSFET is reduced, and it is not suitable for practical use.

From this, it is proved that the samples 1 to 12 can obtain sufficiently high transconductance. This is because that in the samples 1 to 12, the crystal grain diameter of the crystallized amorphous silicon film 43 constituting the gate electrode is made coarse and large, and since the area of the grain bounderies is reduced, the impurities which are ion implanted are prevented from being segregated in the grain bounderies and the carrier concentration in the gate electrode is increased.

Furthermore, it is confirmed that as in the sample 4, when the gate oxide film 5 is subjected to the surface treatment and the amorphous silicon film 3 is subjected to the surface treatment, an especially high value of the Cinv/Cox is obtained.

Next, as to the samples 1 to 12 and the comparative pieces 1 to 3, a maximum value (mS/mm) of transconductance of the p-ch MOSFET and the n-ch MOSFET is measured. In this case, it is selected that $V_{DS}$=3 V. Also, the yield (%) of good pieces of the gate oxide film 5 in a p-ch MOS capacitor and an n-ch MOS capacitor having an ares of 4 $mm^2$ is investigated.

The results are shown in Table 2.

From Table 2, it is confirmed that very high transconductance is obtained. in the samples 1 to 12 as compared with the comparative pieces 1 to 3.

Also from Table 2, it is confirmed that the yield of good pieces is 98% or larger in the samples 1 to 12 whereas it is 96% or less in the comparative pieces 1 to 3.

This is because that in the samples 1 to 12, the crystal grain size of the crystallized silicon film 43 which is the gate electrode material is made coarse and large, and since the carrier concentration in the gate electrode is increased, the generation of a depletion layer in the interface between the gate oxide film 5 and the gate electrode is prevented during operation of the transistor.

EXAMPLE 2

An Example 2 in the present invention will be described with reference to the same drawings as in Example 1. The like parts as in Example 1 are designated with like reference numerals, and the description of its manufacturing process is omitted.

First, as shown in FIG. 1, a gate oxide film 5 of about 7 nm in film thickness is formed on a device forming region of a semiconductor substrate 1.

Subsequently, an amorphous silicon film 3 of about 150 nm in film thickness is formed on the whole surface of the gate oxide film 5 by using a $SiH_4$ gas at temperature of 550° C. The silicon film becomes the amorphous silicon film 3 when formed under the above-mentioned conditions.

Then, the wafer obtained in the process shown in FIG. 1 is maintained in an ammonia gas at a temperature of 500° C. for 10 minutes, and a silicon nitrided film having a thickness of about 5 nm is formed on the surface of the amorphous silicon film 3.

Following this, the wafer is subjected to a thermal treatment in an inactive gas atmosphere at 600° C. for 2 hours thereby to form a crystallized silicon film (polysilicon film) 43.

Thereafter, the processes shown in FIG. 3 and hereafter, are performed to complete a semiconductordevice including complementary MOSFETs.

In Example 2, while the amorphous silicon film 3 is formed just after the formation of the gate oxide film 5, the present invention is not limited to this, and after the gate oxide film 5 is formed, similar to Example 1, the amorphous silicon film 3 maybe formed after the surface of the gate oxide film 5 is terminated by the hydroxyl group by washing the gate oxide film 5 with an aqueous solution, or by exposing the surface of the gate oxide film 5 to a gas atmosphere containing hydrogen.

In Example 2, the wafer formed with the amorphous silicon film 3 is maintained in the ammonia gas at 500° C. for 10 minutes to form the silicon nitrided film on the surface of the amorphous silicon film 3. However, the present invention is not limited to this, and if it is possible to form the silicon nitrided film on the surface of the amorphous silicon film 3 without crystallizing the amorphous silicon film 3, the other atmosphere gases may be used.

Samples 13 to 16 of the present invention are manufactured based on Example 2 under the conditions shown in Table 3. As to the samples 15 and 16, the surface treatment performed in the process shown in FIG. 1 is conducted on the gate oxide film 5.

Furthermore, for the purpose of comparison, as shown in the conditions in Table 3, a semiconductor device including complementary MOSFETs is completed without performing the nitriding treatment on the amorphous silicon film 3 (comparative piece 4).

Then, with respect to the samples 13 to 16 and the comparative piece 4, quasi-static capacitance measurement is conducted as to the p-type region and the n-type region by a method similar to Example 1.

The results are shown in Table 3.

From Table 3, in the samples 13 to 16, the value of Cinv/Cox is as good as 0.98 or larger, however, in the comparative piece 4, the value is 0.95.

From this, it is proved that in the samples 13 to 16, a sufficiently high transconductance is obtained.

Then, with respect to the samples 13 to 16 and the comparative piece 4, a maximum value (mS/mm) of transconductance of the p-ch MOSFET and the n-ch MOSFET is measured in a method similar to that in Example 1.

The results are shown in Table 4.

From table 4, it is confirmed that in the samples 13 to 16, a very high transconductance is obtained as compared with the comparative piece 4.

EXAMPLE 3

Example 3 of the present invention will be described with reference to the drawings.

The like parts are designated with like reference numerals as in Example 1, and the description of its manufacturing process is omitted.

Similar to the process shown in FIG. 1, a gate oxide film 5 of about 7 nm in film thickness is formed on a device forming region of a semiconductor substrate 1.

An amorphous silicon film 3 of about 150 nm in film thickness is formed on the whole surface of the gate oxide film 5 by using a $SiH_4$ gas at temperature of 550° C. The amorphous silicon film 3 obtained in the process shown in FIG. 1 is patterned, and gate electrode 6 having a gate length of 0.35 um is formed in each of n-type region and p-type region.

Thereafter, as shown in FIG. 3, a resist film 9 is coated on the n-type region, and $B^+$ is ion implanted as p-type impurities in the p-type region by using the resist film 9 as a mask with the amount of implantation=$1\times10^{13}/cm^2$ and the implantation energy=10 keV thereby to form a $p^-$ diffusion layer 7 and a $p^-$ diffusion layer 8.

Then, in the process shown in FIG. 4, after removing the resist film 9 formed in the process shown in FIG. 3, a resist 9 is coated on the p-type region. Following this, $P^+$ is ion implanted as n-type impurities in the n-type region by using the resist film 9 as a mask with the amount of implantation= $4\times10^{13}/cm^2$ and the implantation energy=30 keV thereby to form an n diffusion layer 10 and an $n^-$ diffusion layer 11.

Subsequently, the resist film 9 formed in the process shown in FIG. 4 is removed. Then, the wafer is subjected to a thermal treatment at 600° C. in an atmosphere containing $O_2$=10% and $N_2$=90% for 5 hours, so that the gate electrode 6 is crystallized while the surface of the gate electrode 6 is being oxidized.

At this time, the gate electrode 6 is crystallized while the surface of the gate electrode 6 is being formed with a silicon oxide film. Accordingly, at the time of crystallizing the amorphous silicon film 3 constituting the gate electrode 6, the movement of silicon atoms which are present on the surface of the amorphous silicon film 3 is interrupted by the silicon oxide film. As a result, the generation of crystal nuclei of silicon is suppressed, and a grain size of the crystallized silicon film (polysilicon film) is made coarse and large.

Thereafter, the silicon oxide film formed on the surface of he gate electrode 6 is removed, and a gate electrode 6 constituted by the polysilicon film having the coarse and large crystal grain size is formed.

Then, the processes shown in FIG. 5 and the following figures in Example 1 are performed, and a semiconductor device including complementary MOSFETs is completed.

In Example 3, while the amorphous silicon film 3 is formed just after the formation of the gate oxide film 5, the present invention is not limited to this, and after the gate oxide film 5 is formed, similar to Example 1, the amorphous silicon film 3 may be formed after the surface of the gate oxide film 5 is terminated by the hydroxyl group by washing the gate oxide film 5 with an aqueous solution, or by exposing the surface of the gate oxide film 5 to a gas atmosphere containing hydrogen.

Furthermore, while the gate electrode 6 is crystallized in the oxidizing atmosphere, the present invention is not limited to this, and the gate electrode 6 may be crystallized in a nitriding atmosphere, and a similar advantage can be obtained.

Furthermore, in place of the process of crystallization of the gate electrode 6 in the oxidizing atmosphere or the nitriding atmosphere, the gate electrode 6 may be crystallized after forming a CVD film such as a silicon oxide film, a silicon nitrided film, or the like on the gate electrode 6 to obtain a similar advantage.

Samples 17 to 19 of the present invention are manufactured based on Example 3, and under the conditions shown in Table 5. In these samples, in the sample 18, the gate electrode 6 is crystallized in the nitriding atmosphere, and in the sample 19, after the gate oxide film 5 is formed, the gate oxide film 5 is washed with an aqueous solution.

For the purpose of comparison, as shown in the conditions in Table 5, the crystallization of the gate electrode 6 is performed in an atmosphere other than the oxidizing atmosphere and the nitriding atmosphere, and a semiconductor device including complementary MOSFETs is completed (comparative piece 5).

Then, with respect to the samples 17 to 19 and the comparative piece 5, a quasi-static capacitance measurement as to the n-type region and the p-type region is carried out in a similar method as in Example 1.

The results are shown in Table 5.

From Table 5, in the samples 17 to 19, the value of Cinv/Cox is good for both the p-type region and the n-type region whereas the value is 0.95 in the comparative piece 5.

From this, it is confirmed that a sufficiently high transconductance is obtained in the samples 17 to 19.

With respect to the samples 17 to 19 and the comparative piece 5, a maximum value (mS/mm) of transconductance of the p-ch MOSFET and the n-ch MOSFET is measured in a similar method as in Example 1.

The results are shown in Table 6.

From this, it is confirmed that a sufficiently high transconductance is obtained in the samples 17 to 19 as compared with the comparative piece 5.

EXAMPLE 4

Example 4 of the present invention will be described with reference to the drawings.

The like parts are designated with like reference numerals as in Example 1, and the description of its manufacturing process is omitted.

First, the processes from FIGS. 1 to 4 in Example 1 are performed.

Following this, in the process shown in FIG. 5, a resist film 9 is coated on an n-type region, and $BF^+$ is ion implanted as p-type impurities in a p-type region with the amount of implantation=$1\times10^{15}/cm^2$ and the implantation energy=40 KeV by using the resist film 9 as a mask. Then, the resist film 9 is removed.

Subsequently, in the process shown in FIG. 6, a resist film 9 is coated on a p-type region, and $As^+$ is ion implanted as n-type impurities in an n-type region with the amount of implantation=$1\times10^{15}/cm^2$ and the implantation energy=30 KeV by using the resist film 9 as a mask.

Then, after removing the resist film 9, the wafer is placed in a known diffusion furnace, and the wafer is subjected to the thermal treatment at 800° C. for 30 minutes to perform the crystallization of an amorphous silicon film 3 constituting a gate electrode 6 simultaneously with the activation of the impurities.

In this manner, by ion implanting the impurities when the gate electrode is in an amorphous condition, and by activating the impurities simultaneously with the crystallization of an amorphous silicon electrode, the impurities are deeply diffused with the progress of the crystallization of the amorphous silicon electrode. As a result, the carrier concentration in the crystallized silicon film (gate electrode) is increased relatively at a low temperature and in a short time.

Then, the processes in FIG. 7 and hereafter are performed, and a semiconductor device including complementary MOSFETs is completed (sample 20).

For the purpose of comparison, in the process shown in FIG. 1, the formed amorphous silicon film 3 is subjected to a thermal treatment in an inactive gas atmosphere at 600° C. for 2 hours, thereby to form a polysilicon film by crystallizing the amorphous silicon film 3. Following this, the process similar to Example 4 is performed, and a semiconductor device including complementary MOSFETs is completed (comparative piece 6).

With respect to the sample 20 and the comparative piece 6, a quasi-static capacitance measurement is performed as to the p-type region and the n-type region in a similar method as in Example 1.

The results are shown in Table 7.

Form table 7, in the sample 20, the value of Cinv/Cox is as good as 0.99 or larger as to both the p-type region and the n-type region whereas in the comparative piece 6, the value is 0.95.

From this, it is confirmed that in the sample 20, a sufficiently high transconductance is obtained. This is because that in the sample 20, by ion implanting the impurities when the gate electrode is in an amorphous condition, and by activating the impurities simultaneously with the crystallization of the amorphous silicon electrode, the impurities are deeply diffused with the progress of the crystallization of the amorphous silicon electrode, and the carrier concentration in the crystallized silicon film (gate electrode) is increased relatively at a low temperature and in a short time.

With respect to the sample 20 and the comparative piece 6, a maximum value (mS/mm) of transconductance of the p-ch MOSFET and the n-ch MOSFET is measured in a similar method as in Example 1.

The results are shown in Table 8.

From this, it is confirmed that a sufficiently high transconductance is obtained in the sample 20 as compared with the comparative piece 6.

This is because that in the sample 20, since the carrier concentration in the gate electrode is increased, it becomes possible to prevent the generation of a depletion layer in the interface between the gate oxide film 5 and the gate electrode during the operation of the transistor.

EXAMPLE 5

Example 5 will be described with reference to the same drawings as in Example 1.

In the process shown in FIG. 1, a gate oxide film 5 of about 7 nm in film thickness is formed on a device forming region of a semiconductor substrate 1. Subsequently, by using an $Si_2H_6$ gas, and at a film forming temperature of 480° C., a silicon film 3 of about 150 nm in film thickness is formed on the whole surface of the wafer. This silicon film 3 becomes an amorphous silicon film by forming under the conditions mentioned above.

Then, in the process shown in FIG. 3, the amorphous silicon film 3 obtained in the process shown in FIG. 1 is patterned, and a gate electrode 6 having a gate length of 0.35 um is formed in each of regions respectively for forming an n-type device and a p-type device. Following this, a resist film 9 is coated on the n-type device forming region of the wafer, and by using this film as a mask, $B^+$ (boron) is ion implanted as p-type impurities into the p-type device forming region with the amount of implantation=$1\times10^{13}$/cm$^2$ and the implantation energy=10 KeV thereby to form a p$^-$ diffusion layer 7 and a p$^-$ diffusion layer 8, and a p-type gate electrode 16.

In the process shown in FIG. 4, the resist film 9 formed in the process shown in FIG. 3 is removed, and a resist film 9 is coated on the p-type device forming region of the wafer, and by using this film as a mask, P$^+$ (phosphorous) is ion implanted as n-type impurities into the n-type device forming region with the amount of implantation=$4\times10^{13}$/cm$^2$ and the implantation energy=30 KeV thereby to form an n$^-$ diffusion layer 10 and an n$^-$ diffusion layer 11.

In the process shown in FIG. 5, the resist film 9 formed in the process shown in FIG. 4 is removed, and after forming side walls on each gate electrode, a resist film 9 is coated on the n-type device forming region, and by using this film as a mask, BF$_2^+$ (boron fluoride) is ion implanted in the p-type device forming region as p-type impurities with the amount of implantation=$2\times10^{15}$/cm$^2$ and the implantation energy=40 KeV thereby to form a p$^+$ diffusion layer 12 and a p$^+$ diffusion layer 14 and a p-type gate electrode 16.

Then, in the process shown in FIG. 6, the resist film 9 formed in the process shown in FIG. 5 is removed, and a resist film 9 is coated on the p-type device forming region of the wafer, and by using this film as a mask, As$^+$ (arsenic) is ion implanted in the n-type device forming region as n-type impurities with the amount of implantation=$3\times10^{15}$/cm$^2$ and the implantation energy=40 KeV thereby to form an n$^+$ diffusion layer 17 and an n$^+$ diffusion layer 19 and a p-type gate electrode 26.

Subsequently, the wafer with the ion implantation has been completed is placed in a diffusion furnace, and the wafer is subjected to a thermal treatment at 850° C. for 30 minutes. In this manner, the impurities are activated, and a source 13 including the p$^-$ diffusion layer 7 and the p$^+$ diffusion layer 12, a drain 15 including the p$^-$ diffusion layer 8 and the p$^+$ diffusion layer 14, a source 18 including the n$^-$ diffusion layer 10 and the n$^+$ diffusion layer 17, and a drain 21 including the n$^-$ diffusion layer 11 and the n$^+$ diffusion layer 19 are formed.

Then, the processes in FIG. 7 and hereafter similar to Example 1 are performed, and a dual-gate MOS is completed.

In Example 5, in the process shown in FIG. 1, by using the Si$_2$H$_6$ gas and at temperature of 480° C., the silicon film 3 is formed, however, the present invention is not limited to this, and the silicon film 3 may be formed by using the Si$_2$H$_6$ gas and at a film forming temperature of 580° C. or lower.

For the purpose of comparison, in the process shown in FIG. 1, instead of forming the amorphous silicon film, a polysilicon film of about 150 nm in film thickness is formed by using an SiH$_4$ gas at temperature of 620° C. Thereafter, the processes in FIG. 2 and hereafter are performed, and a semiconductor device including complementary MOSFETs is completed as a comparative piece.

Then, a polysilicon sheet resistance of the complementary MOSFETs (sample) obtained in Example 5, and a polysilicon sheet resistance of the comparative piece are measured as to the n-type device forming region and the p-type device forming region. The result of measurement in the n-type device forming region is shown in FIG. 10, and the result of measurement in, the p-type device forming region is shown in FIG. 11.

Figure 10:
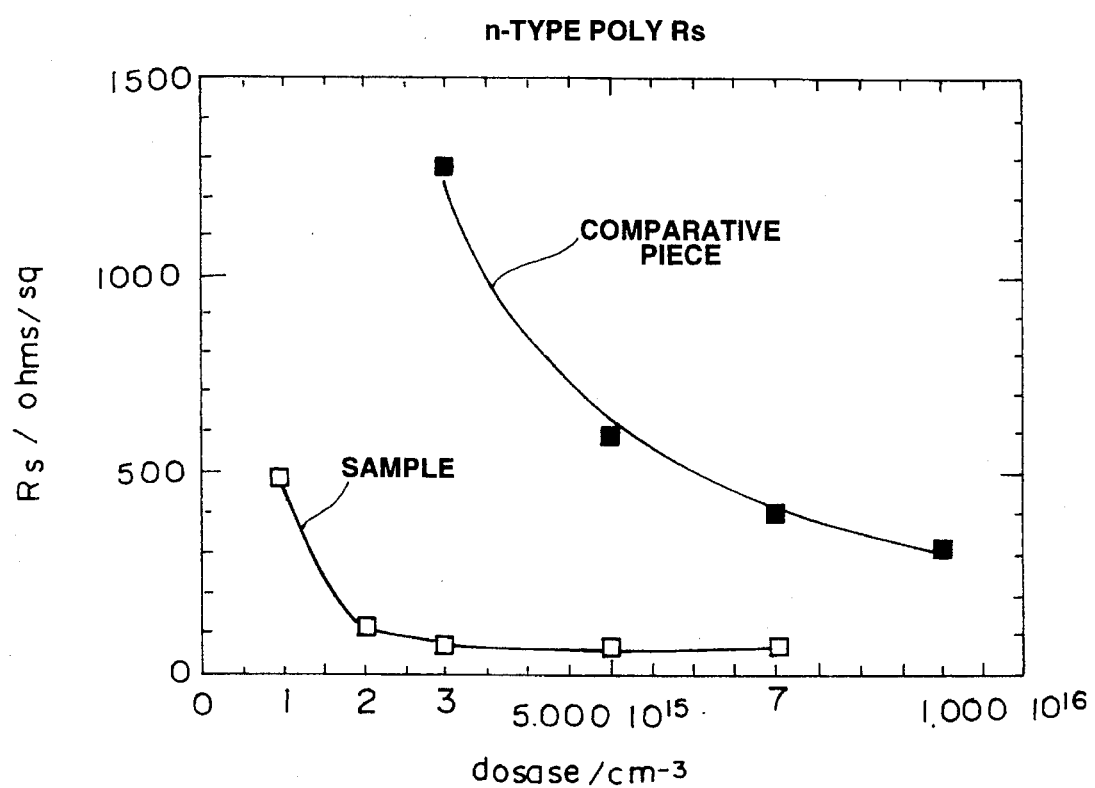
FIG. 10 is a graph of an $n^+$ polysilicon sheet resistance of the complementary MOSFETs in the example 5 and in the comparative piece.
Figure 11:
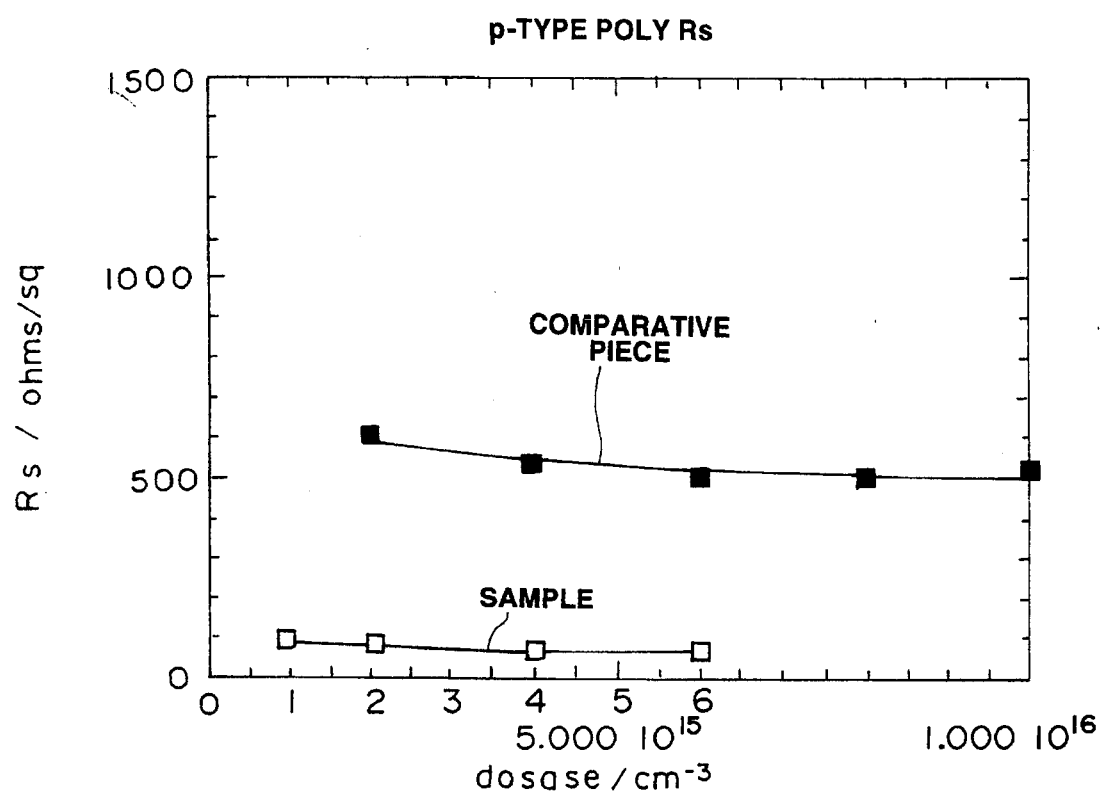
FIG. 11 is a graph of a $p^+$ polysilicon sheet resistance of the complementary MOSFETs in the example 5 and the comparative piece.

From FIGS. 10 and 11, it is confirmed that the polysilicon sheet resistance of the sample of the present invention has a very low value as compared with that of the comparative piece. From this, it is proved that in the sample, a high carrier concentration of the gate electrode can be obtained by implanting the same amount of impurities as the amount of impurities which is implanted into the source and the drain.

EXAMPLE 6

Example 6 will be described with reference to the drawings.

Figure 8:
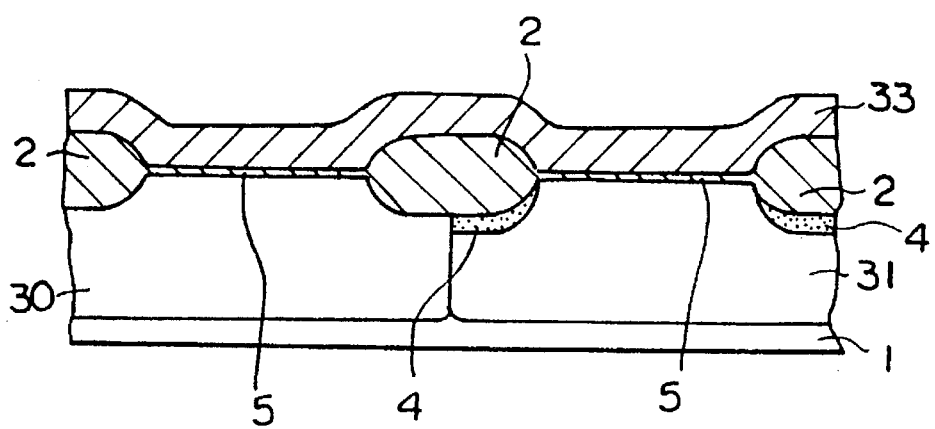
FIG. 8 is a partial sectional view showing a part of a manufacturing method of a semiconductor device of an example 6 of the present invention.
Figure 9:
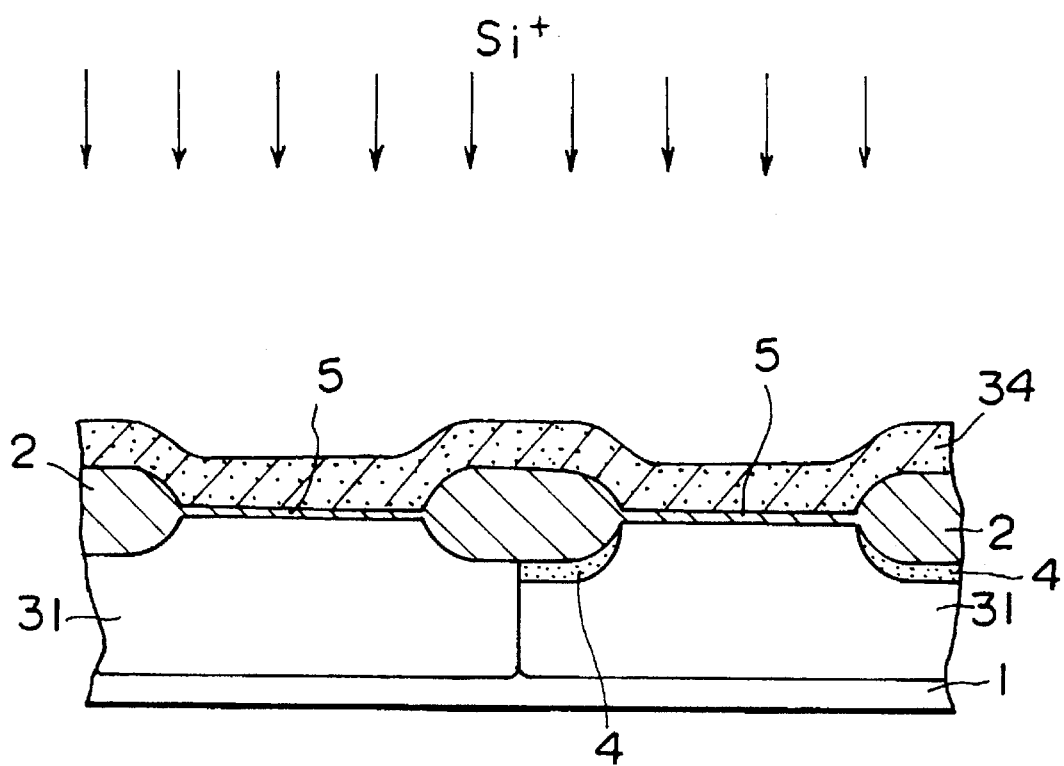
FIG. 9 is a partial sectional view showing a part of a manufacturing method of a semiconductor device of the example 6 of the present invention.

FIGS. 8 and 9 show a partial sectional view illustrating a part of manufacturing process of a dual-gate CMOS in the Example 6. The like parts are designated with like reference numerals as in FIG. 1.

In the process shown in FIG. 8, a gate oxide film 5 of about 7 nm in film thickness is formed on a device forming region of a semiconductor substrate 1. Following this, by using an SiH$_4$ gas, and at temperature of 620° C., a polysilicon film 33 of about 150 nm in film thickness is formed on the whole surface of the gate oxide film 5.

Then, in process shown in FIG. 9, silicon ions (Si$^+$) are ion implanted into the polysilicon film 33 obtained in the process shown in FIG. 8 with the amount of implantation= $5\times10^{15}$/cm$^2$ and the implantation energy=40 KeV thereby to form a polysilicon film 34 having Si implanted therein. By doing in this manner, the crystals of the polysilicon film 33 are transformed to amorphous, and the grain bounderies can be eliminated.

Subsequently, the processes shown in FIG. 2 and hereafter in Example 1 are performed, and a semiconductor device including complementary MOSFETs is completed. However, in this case, the ion implanting conditions shown in FIGS. 5 and 6 are set in that BF$_2^+$ is implanted with the amount of implantation=$1\times10^{15}$/cm$^2$ and the implantation energy=40 KeV, and As$^+$ is implanted with the amount of implantation=$2\times10^{15}$/cm$^2$ and the implantation energy=40 KeV.

In Example 6, in the process shown in FIG. 9, Si$^+$ is ion implanted into the polysilicon film 33, however, it is not limited to this, and Ge$^+$ may be ion implanted.

Furthermore, the ion implanting conditions of Si$^+$ and Ge$^+$ may be determined as desired.

For the purpose of comparison with sample 21 manufactured according to Example 6, comparative pieces 7 and 8 are manufactured without ion implanting Si$^+$ into the polysilicon film. With respect to the sample 21 and the comparative pieces 7 and 8, a quasi-static capacitance measurement (Cinv/Cox) and a measurement of a maximum value of transconductance are performed, and the results of the measurements are respectively shown in Tables 9 and 10.

From Table 9, in sample 21, a value of Cinv/Cox is 0.98 or larger, and it is confirmed that a sufficiently high transconductance can be ensured. This is because that since the silicon ions are implanted into the polysilicon film, the polysilicon film is transformed to an amorphous structure, and furthermore, since the amorphous structure is crystallized thereafter, the impurity ions which are ion implanted are not segregated in the grain bounderies, and the carrier concentration in the gate electrode is increased.

In contrast, in comparative piece 7, a value of Cinv/Cox is 0.95 or less, and it is confirmed that a transconductance of the MOSFET is reduced, and it is not suitable for practical use. This is because that since the SiH$_4$ gas is used, and since the silicon film is formed at the film forming temperature of 620° C., the silicon film assumes the polysilicon structure, and the impurities which are ion implanted are segregated in the grain bounderies which are formed.

Furthermore, in comparative piece 8, a value of Cinv/Cox is 0.99, and it is possible to ensure a sufficiently high transconductance, however, since the amount of ion implantation is large, a punch through occurs in the MOSFET and it is impossible to use practically.

From Table 10, sample 21 of the complementary MOSFET in Example 6 ensures a very high transconductance as compared with comparative pieces 7 and 8.

TABLE 1 (1)

|  |  | SAMPLE 1 | SAMPLE 2 | SAMPLE 3 | SAMPLE 4 | SAMPLE 5 | SAMPLE 6 | SAMPLE 7 | SAMPLE 8 |
|---|---|---|---|---|---|---|---|---|---|
| FILM THICKNESS (nm) OF GATE OXIDE FILM | | 7.1 | 7.1 | 7.1 | 7.1 | 7.1 | 7.1 | 7.1 | 7.1 |
| SURFACE TREATING METHOD OF GATE OXIDE FILM | TREATING LIQUID OR TREATING GAS | — | — | — | $NH_4OH$ (1) $H_2O_2$(1) $H_2O$(5) | — | — | $NH_4OH$ (1) $H_2O_2$(1) $H_2O$(5) | HF AQUEOUS SOLUTION |
|  | TEMPERATURE (°C.) | — | — | — | 40 | — | — | 40 | 25 |
|  | TIME (MIN) | — | — | — | 1 | — | — | 1 | 1/6 |
| FORMING METHOD OF AMORPHOUS SILICON FILM | SOURCE GAS | | | $Si_2H_6$ | | $SiH_4$ | $Si_3H_8$ | | $Si_2H_6$ |
|  | TEMPERATURE (°C.) | | | 480 | | 440 | 450 | | 480 |
|  | FILM THICKNESS (nm) | 152 | 149 | 150 | 151 | 151 | 153 | 148 | 151 |
| SURFACE TREATING METHOD OF AMORPHOUS SILICON FILM | TREATING LIQUID OR TREATING GAS | $O_2$ GAS | $N_2O$ GAS | STEAM | $O_2$ GAS | $O_2$ GAS | $O_2$ GAS | — | — |
|  | TEMPERATURE (°C.) | 200 | 400 | 200 | 400 | 200 | 200 | — | — |
|  | TIME (MIN) | 10 | 10 | 5 | 10 | 10 | 10 | — | — |
| AVERAGE CRYSTAL GRAIN SIZE (μm) OF POLYSILICON | | 2.7 | 2.4 | 2.6 | 3.1 | 2.7 | 2.8 | 3.3 | 3.1 |
| Cinv/Cox | p-TYPE REGION | 0.99 | 0.99 | 0.99 | 0.99 | 0.99 | 0.99 | 0.98 | 0.99 |
|  | n-TYPE REGION | 0.99 | 0.99 | 0.99 | 1.00 | 0.99 | 0.99 | 0.99 | 0.99 |

TABLE 1 (2)

|  |  | SAMPLE 9 | SAMPLE 10 | SAMPLE 11 | SAMPLE 12 | COMPARATIVE PIECE 1 | COMPARATIVE PIECE 2 | COMPARATIVE PIECE 3 |
|---|---|---|---|---|---|---|---|---|
| FILM THICKNESS (nm) OF GATE OXIDE FILM | | 7.1 | 7.1 | 7.1 | 7.1 | 7.1 | 7.1 | 7.1 |
| SURFACE TREATING METHOD OF GATE OXIDE FILM | TREATING LIQUID OR TREATING GAS | $H_2$ GAS | STEAM | — | — | — | — | — |
|  | TEMPERATURE (°C.) | 400 | 400 | — | — | — | — | — |
|  | TIME (MIN) | 20 | 10 | — | — | — | — | — |
| FORMING METHOD OF AMORPHOUS SILICON FILM | SOURCE GAS | | | $Si_2H_6$ | | $Si_2H_6$ | $SiH_4$ | $SiH_4$ |
|  | TEMPERATURE (°C.) | | | 480 | | 480 | 550 | 620 |
|  | FILM THICKNESS (nm) | 153 | 149 | 150 | 153 | 151 | 151 | 149 |
| SURFACE TREATING METHOD OF AMORPHOUS SILICON FILM | TREATING LIQUID OR TREATING GAS | — | — | $NH_4OH$ WATER | $O_3$ WATER | — | — | — |
|  | TEMPERATURE (°C.) | — | — | 40 | 40 | — | — | — |
|  | TIME (MIN) | — | — | 10 | 10 | — | — | — |
| AVERAGE CRYSTAL GRAIN DIAMETER (μm) OF POLYSILICON | | 2.6 | 3.1 | 2.7 | 2.8 | 0.91 | 0.51 | 0.05 |
| Cinv/Cox | p-TYPE REGION | 0.99 | 0.99 | 0.99 | 0.99 | 0.95 | 0.93 | 0.93 |
|  | n-TYPE REGION | 0.99 | 0.99 | 0.99 | 0.99 | 0.96 | 0.94 | 0.93 |

TABLE 2

|  | MAX. VALUE OF TRANSCONDUCTANCE (mS/mm) | | YIELD OF GATE OXIDE FILM (%) | |
| --- | --- | --- | --- | --- |
|  | pMOSFET | pMOSFET | pMOS CAPACITOR | nMOS CAPACITOR |
| SAMPLE 1 | 121 | 236 | 98 | 100 |
| SAMPLE 2 | 126 | 242 | 98 | 98 |
| SAMPLE 3 | 129 | 246 | 100 | 100 |
| SAMPLE 4 | 133 | 251 | 98 | 98 |
| SAMPLE 5 | 113 | 240 | 100 | 98 |
| SAMPLE 6 | 115 | 228 | 98 | 100 |
| SAMPLE 7 | 109 | 219 | 100 | 100 |
| SAMPLE 8 | 121 | 241 | 100 | 98 |
| SAMPLE 9 | 123 | 238 | 98 | 98 |
| SAMPLE 10 | 119 | 223 | 98 | 100 |
| SAMPLE 11 | 98 | 219 | 100 | 98 |
| SAMPLE 12 | 120 | 241 | 98 | 98 |
| COMPARATIVE PIECE 1 | 99 | 192 | 96 | 92 |
| COMPARATIVE PIECE 2 | 89 | 189 | 88 | 90 |
| COMPARATIVE PIECE 3 | 88 | 179 | 36 | 28 |

TABLE 3

| | | SAMPLE 13 | SAMPLE 14 | SAMPLE 15 | SAMPLE 16 | COMPARATIVE PIECE 4 |
| --- | --- | --- | --- | --- | --- | --- |
| | FILM THICKNESS (nm) OF GATE OXIDE FILM | 7.1 | 7.1 | 7.1 | 7.1 | 7.1 |
| SURFACE TREATING METHOD OF GATE OXIDE FILM | TREATING LIQUID OR TREATING GAS | — | — | $NH_4OH(1):H_2O_2(1):H_2O(5)$ | | — |
| | TEMPERATURE (°C.) | — | — | 40 | 70 | — |
| | TIME (MIN) | — | — | 1 | 1 | — |
| FORMING METHOD OF AMORPHOUS SILICON FILM | SOURCE GAS | $SiH_4$ | $SiH_4$ | $Si_2H_6$ | $Si_3H_8$ | $SiH_4$ |
| | TEMPERATURE (°C.) | 550 | 550 | 480 | 420 | 550 |
| | FILM THICKNESS (nm) | 149 | 152 | 151 | 152 | 152 |
| NITRIDING CONDITON OF AMORPHOUS SILICON FILM AND FORMING CONDITION OF NITRIDED SILICON FILM | SOURCE GAS | $NH_3$ | $NH_3 + N_2O$ PLASMA CVD | $NH_3$ | $NH_3$ | — |
| | TEMPERATURE | 500 | 350 | 450 | 450 | — |
| | FILM THICKNESS (nm) | 3.1 | 50 | 2.1 | 2.2 | — |
| Cinv/Cox | p-TYPE REGION | 0.9 | 0.98 | 0.99 | 0.99 | 0.95 |
| | n-TYPE REGION | 0.99 | 0.98 | 0.99 | 0.99 | 0.95 |

TABLE 4

|  | MAX. VALUE OF TRANSCONDUCTANCE (mS/mm) | |
| --- | --- | --- |
|  | pMOSFET | nMOSFET |
| SAMPLE 13 | 112 | 218 |
| SAMPLE 14 | 110 | 206 |
| SAMPLE 15 | 107 | 212 |
| SAMPLE 15 | 101 | 202 |
| COMPARATICE PIECE 4 | 89 | 182 |

TABLE 6

|  | MAX. VALUE OF TRANSCONDUCTANCE (mS/mm) | |
| --- | --- | --- |
|  | pMOSFET | nMOSFET |
| SAMPLE 17 | 115 | 221 |
| SAMPLE 18 | 109 | 214 |
| SAMPLE 19 | 124 | 249 |
| COMPARATICE PIECE 5 | 93 | 182 |

TABLE 5

|  |  | SAMPLE 17 | SAMPLE 18 | SAMPLE 19 | COMPARATIVE PIECE 4 |
|---|---|---|---|---|---|
| FILM THICKNESS (nm) OF GATE OXIDE FILM | | 7.1 | 7.1 | 7.1 | 7.1 |
| SURFACE TREATING METHOD OF GATE OXIDE FILM | TREATING LIQUID OR TREATING GAS | — | — | NH$_4$OH(1) H$_2$O$_2$(1) | — |
|  | TEMPERATURE (°C.) | — | — | 40 | — |
|  | TIME (MIN) | — | — | 1 | — |
| FORMING METHOD OF AMORPHOUS SILICON FILM | SOURCE GAS | SiH$_4$ | SiH$_4$ | Si$_2$H$_6$ | SiH$_4$ |
|  | TEMPERAURE (°C.) | 550 | 550 | 480 | 550 |
|  | FILM THICKNESS (nm) | 149 | 152 | 151 | 152 |
| ATMOSPHERE IN CRYSTALLIZING AMORPHOUS SILICON FILM | SOURCE GAS | O$_2$ + N$_2$ | NH$_3$ | O$_2$ + N$_2$ | — |
|  | TEMPERATURE (°C.) | 600 | 600 | 600 | — |
| Cinv/Cox | p-TYPE REGION | 0.99 | 0.99 | 0.99 | 0.95 |
|  | n-TYPE REGION | 0.99 | 0.99 | 0.99 | 0.95 |

TABLE 7

|  |  | SAMPLE 20 | COMPARATIVE PIECE 6 |
|---|---|---|---|
| FILM THICKNESS OF GATE OXIDE FILM (nm) | | 7.1 | 7.1 |
| Cinv/Cox | p TYPE REGION | 0.99 | 0.95 |
|  | n TYPE REGION | 0.99 | 0.95 |

TABLE 8

|  | MAX. VALUE OF TRANSCONDUCTANCE (mS/mm) | |
|---|---|---|
|  | pMOSFET | nMOSFET |
| SAMPLE 20 | 122 | 241 |
| COMPARATICE PIECE 6 | 93 | 182 |

TABLE 10

|  | MAX. VALUE OF TRANSCONDUCTANCE (mS/mm) | |
|---|---|---|
|  | pMOSFET | nMOSFET |
| SAMPLE 21 | 251 | 126 |
| COMPARATICE PIECE 8 | 245 | 125 |
| COMPARATICE PIECE 7 | 191 | 93 |

TABLE 9

|  |  |  | SAMPLE 21 | COMPARATIVE PIECE 8 | COMPARATIVE PIECE 7 |
|---|---|---|---|---|---|
| FORMING METHOD OF SILICON FILM | SOURCE GAS | | SiH$_4$ | SiH$_4$ | SiH$_4$ |
|  | FILM FORMING TEMPERATURE (°C.) | | 620 | 620 | 620 |
|  | FILM THICKNESS (nm) | | 151 | 150 | 150 |
| ION IMPLANTING CONDITION | KIND OF ION | p-TYPE REGION | BF$_2^+$ | B$^+$ | BF$_2^+$ |
|  |  | b-TYPE REGION | As$^+$ | P$^+$ | As$^+$ |
|  | AMOUNT OF IMPLANTATION | p-TYPE REGION | 1 × 10$^{15}$ | 8 × 10$^{15}$ | 1 × 10$^{15}$ |
|  |  | b-TYPE REGION | 2 × 10$^{15}$ | 7 × 10$^{15}$ | 2 × 10$^{15}$ |
|  | Cinv/Cox | p-TYPE REGION | 0.99 | 0.99 | 0.94 |
|  |  | b-TYPE REGION | 0.98 | 0.99 | 0.93 |

What is claimed is:

1. A method of manufacturing a dual-gate CMOS device including both an n-channel FET having an n-type impurity doped polysilicon gate and a p-channel FET having a p-type impurity doped polysilicon gate, said method comprising:

forming a gate insulating film on a device forming region;

forming an amorphous silicon film on said gate insulating film;

one of oxidizing and nitriding a surface of said amorphous silicon film forming an oxide/nitride film thickness of less than about 100 angstroms to suppress movement of silicon atoms on the surface of said amorphous silicon film; and after completing the one of oxidizing and nitriding step, crystallizing said amorphous silicon film to form a polysilicon film having a grain size between about 2.4 µm and 3.3 µm.

2. The method of claim 1, wherein the one of oxidizing and nitriding step comprises forming a CVD film thickness of less than about 100 angstroms to suppress movement of silicon atoms on the surface of said amorphous silicon film.

3. A method of manufacturing a dual-gate CMOS device including both an n-channel FET having an n-type impurity doped polysilicon gate and a p-channel FET having a p-type impurity doped polysilicon gate, said method comprising:

forming a gate insulating film on a device forming region;

forming an amorphous silicon film on said gate insulating film;

patterning said amorphous silicon film;

coating a surface of said amorphous silicon film by placing a CVD film on the surface of said amorphous silicon film forming an oxide/nitride film thickness of less than about 100 angstroms to suppress movement of silicon atoms on the surface of said amorphous silicon film; and after completing the coating step, crystallizing said amorphous silicon film to form a polysilicon film having a grain size between about 2.4 µm and 3.3 µm.

4. A method of manufacturing a dual-gate CMOS device including both an n-channel FET having an n-type impurity doped polysilicon gate and a p-channel FET having a p-type impurity doped polysilicon gate, said method comprising:

forming a gate insulating film on a device forming region;

forming an amorphous silicon film on said gate insulating film;

patterning said amorphous silicon film; and crystallizing said amorphous silicon film after said patterning step in one of an oxidizing atmosphere and a nitriding atmosphere to form a polysilicon film having a grain size between about 2.4 µm and 3.3 µm.

5. A method of manufacturing a dual-gate CMOS device including both an n-channel FET having an n-type impurity doped polysilicon gate and a p-channel FET having a p-type impurity doped polysilicon gate, said method comprising:

forming a gate insulating film on a device forming region;

forming an amorphous silicon film on said gate insulating film;

patterning said amorphous silicon film to form a first gate electrode and a second gate electrode;

forming side walls of substantially equal size on sides of the first and second gate electrodes;

after forming the side walls step, introducing n-type impurities into an n-channel FET forming region and the first gate electrode and introducing p-type impurities into a p-channel FET forming region and the second gate electrode; and after completing the impurities introducing step, crystallizing said amorphous silicon film by forming an oxide/nitride film thickness of less than about 100 angstroms on an amorphous silicon surface to suppress movement of silicon atoms on the surface of said amorphous silicon film at a temperature of less than about 900° C. to form a polysilicon film having a grain size between about 2.4 µm and 3.3 µm.

6. A method of manufacturing a dual-gate CMOS device including both an n-channel FET having an n-type impurity doped polysilicon gate and a p-channel FET having a p-type impurity doped polysilicon gate, said method comprising:

forming a gate insulating film on a device forming region;

forming an amorphous silicon film on said gate insulating film by using a disilane at a temperature of at most 580° C.;

patterning said amorphous silicon film to form a first gate electrode and a second gate electrode;

after the patterning step, introducing n-type impurities into an n-channel FET forming region and the first gate electrode and introducing p-type impurities into a p-channel FET forming region and the second gate electrode; and after completing the impurities introducing step, crystallizing said amorphous silicon film by forming an oxide/nitride film thickness of less than about 100 angstroms on an amorphous silicon surface to suppress movement of silicon atoms on the surface of said amorphous silicon film to form a polysilicon film having a grain size between about 2.4 µm and 3.3 µm.

7. A method of manufacturing a dual-gate CMOS device including both an n-channel FET having an n-type impurity doped polysilicon gate and a p-channel FET having a p-type impurity doped polysilicon gate, said method comprising:

forming a gate insulating film on a device forming region;

forming a polysilicon film on said gate insulating film;

introducing one of Si ions and Ge ions into said polysilicon film to transform said polysilicon film into an amorphous silicon film;

patterning said amorphous silicon film to form a first gate electrode and a second gate electrode;

after the patterning step, introducing n-type impurities into an n-channel FET forming region and the first gate electrode and introducing p-type impurities into a p-channel FET forming region and the second gate electrode; and after completion of the impurities introducing step, crystallizing said amorphous silicon film by forming an oxide/nitride film thickness of less than about 100 angstroms on an amorphous silicon surface to suppress movement of silicon atoms on the surface of said amorphous silicon film to form a polysilicon film having a grain size between about 2.4 µm and 3.3 µm.

8. A method of manufacturing a dual-gate CMOS device including both an n-channel FET having an n-type impurity doped polysilicon gate and a p-channel FET having a p-type impurity doped polysilicon gate on a same substrate, said method comprising:

forming a gate insulating film on a device forming region;

washing the gate insulating film with an aqueous solution to bond hydroxyl groups to the surface of said gate insulating film;

exposing the gate insulating film to a gas containing hydrogen;

after completing the washing and exposing steps, forming an amorphous silicon film on a whole surface of the same substrate; and crystallizing said amorphous silicon film to form a polysilicon film having a grain size between about 2.4 μm and 3.3 μm.

9. The method of claim 8, wherein the exposing the gate insulating film step comprises exposing the gate insulating film to one of a hydrogen ion and a hydrogen radical.

10. A method of manufacturing a dual-gate CMOS device including both an n-channel FET having an n-type impurity doped polysilicon gate and a p-channel FET having a p-type impurity doped polysilicon gate on a same substrate, said method comprising:

forming a gate insulating film on a device forming region;

washing the gate insulating film with an aqueous solution to bond hydroxyl groups to the surface of said gate insulating film;

after completing the washing step, forming an amorphous silicon film on a whole surface of the same substrate; and crystallizing said amorphous silicon film to form a polysilicon film having a grain size between about 2.4 μm and 3.3 μm, wherein said amorphous silicon film is formed by one of disilane and trisilane.

* * * * *